(12) United States Patent
Yamada

(10) Patent No.: US 7,725,794 B2
(45) Date of Patent: May 25, 2010

(54) INSTRUCTION ADDRESS GENERATION FOR TEST APPARATUS AND ELECTRICAL DEVICE

(75) Inventor: Tatsuya Yamada, Tokyo (JP)

(73) Assignee: Advantest Corporation, Tokyo (JP)

( * ) Notice: Subject to any disclaimer, the term of this patent is extended or adjusted under 35 U.S.C. 154(b) by 550 days.

(21) Appl. No.: 11/689,483

(22) Filed: Mar. 21, 2007

(65) Prior Publication Data

US 2008/0235539 A1    Sep. 25, 2008

(51) Int. Cl.
*G06F 11/00*    (2006.01)
*G06F 13/00*    (2006.01)

(52) U.S. Cl. ...................... 714/743; 711/118
(58) Field of Classification Search .............. 714/724, 714/738, 743; 711/118, 125, 145, 200, 219
See application file for complete search history.

(56) References Cited

U.S. PATENT DOCUMENTS

| | | | | |
|---|---|---|---|---|
| 5,210,850 A | * | 5/1993 | Kelly et al. | 710/220 |
| 5,249,286 A | * | 9/1993 | Alpert et al. | 711/125 |
| 5,487,162 A | * | 1/1996 | Tanaka et al. | 711/145 |
| 6,836,868 B1 | * | 12/2004 | Arkin et al. | 714/743 |
| 2005/0198442 A1 | * | 9/2005 | Mandler | 711/145 |
| 2008/0126068 A1 | * | 5/2008 | O'Niell et al. | 703/20 |

FOREIGN PATENT DOCUMENTS

| | | |
|---|---|---|
| JP | 63216151 | 9/1988 |
| JP | 10-078476 | 3/1998 |
| JP | 2000206210 | 7/2000 |
| JP | 2002521698 | 7/2002 |
| JP | 2006252361 | 9/2006 |
| WO | 2004109307 | 12/2004 |

OTHER PUBLICATIONS

"Using branch handling hardware to support profile-driven optimization" by Conte et al. This paper appears in: Microarchitecture, 1994. Micro-27. Proceedings of the 27th Annual International Symposium on Publication Date: Nov. 30-Dec. 2, 1994 on page(s): 12-21 ISSN: 1072-4451 ISBN: 0-89791-707-3 Inspec Accession No.: 4875092.*

* cited by examiner

*Primary Examiner*—Cynthia Britt
(74) *Attorney, Agent, or Firm*—Osha • Liang LLP

(57) ABSTRACT

There is provided a test apparatus that tests a device under test. The test apparatus includes a main memory that stores a test instruction stream determining a test sequence for testing the device under test, a sequence cache memory that caches the test instruction stream, a transfer section that reads the test instruction stream stored on the main memory and writes the read stream into the sequence cache memory in accordance with a described sequence, a pattern generating section that sequentially reads and executes instructions from the test instruction stream cached on the sequence cache memory and outputs a test pattern corresponding to the executed instruction, and a test signal output section that generates a test signal according to the test pattern and supplies the generated signal to the device under test, in which the transfer section overwrites the instruction read from the main memory on a space area on the sequence cache memory or an area on which executed instructions are stored and prohibits overwriting the read instruction on an area on which instructions in a predetermined range is stored, the instructions being located in the predetermined range forward from a final instruction among the executed instructions according to the described sequence.

9 Claims, 10 Drawing Sheets

MAIN MEMORY 40

| ADDRESS | SEQUENCE DATA | PATTERN DATA |
|---|---|---|
| XX00 | NOP | CH2 CH2 ... |
| XX01 | NOP | H H L L H H ... |
| ... | ... | H L H L H L ... |
| XX10 | JMP XXXX | L L L L L ... |
| | EXIT | |
| YY00 | NOP | PATTERN A |
| YY01 | LOOPST | PATTERN B |
| ... | ... | PATTERN C |
| YY25 | LOOP END | PATTERN D |
| | EXIT | |
| ZZ00 | XXX | XXX |
| | XXX | XXX |
| ... | ... | ... |
| ZZXX | XXX | XXX |

PATTERN LIST MEMORY 14

| SEQUENCE DATA 2 |
| SEQUENCE DATA 1 |
| SEQUENCE DATA 3 |
| ... |

FIG. 3

TEST INSTRUCTION STREAM

```
XXXX     NOP

XXXX     NOP
           .
           .
           .
XXXX     JMP      X
           .
           .
           .
XXXX     IDXI     Y
           .
           .
           .
XXXX     EXIT
```

FIG. 5

INSTRUCTION ADDRESS GENERATION FOR TEST APPARATUS AND ELECTRICAL DEVICE

BACKGROUND

1. Field of the Invention

The present invention relates to a test apparatus and an electronic device. More particularly, the present invention relates to a test apparatus that tests a device under test and an electronic device including a test circuit that tests a circuit under test.

2. Related Art

A test apparatus for testing a device under test such as a semiconductor has been known. The test apparatus supplies a test signal with a predetermined logical pattern to the device under test, and detects a signal output from the device under test in accordance with this test signal. Then, the test apparatus compares the detected signal and an expected value to decide the good or bad of the device under test.

The test apparatus includes a main memory such as DRAM that stores sequence data (a test instruction stream), a cache memory that temporarily stores a test instruction stream, a transfer section that transfers sequence data from the main memory to the cache memory, a pattern generator that sequentially generates a test pattern, and a test signal output section that outputs a test signal with logic according to the test pattern. The pattern generator sequentially reads instructions from the sequence data stored on the cache memory, and executes the read instructions. Then, the pattern generator reads pattern data corresponding to the executed instructions from the memory, and sequentially outputs the read pattern data as test patterns. According to this, the test apparatus can supply a test signal with a predetermined logical pattern to the device under test.

Moreover, the transfer section sequentially reads sequence data from the main memory, and writes the read data into a space area on the cache memory. When the space area on the cache memory vanishes, the transfer section overwrites the read sequence data on an area on which an executed instruction is stored.

Meanwhile, the test apparatus can include a forward branch instruction in sequence data (for example, see Japanese Patent Application Publication No. 1998-78476). However, since an instruction to be executed next to the forward branch instruction is an already-executed instruction, the instruction may be overwritten by the transfer section. In this case, the pattern generator cannot read an instruction next to the forward branch instruction from the cache memory.

Moreover, in order to generate a test pattern every clock cycle, the pattern generator must perform a series of processes for reading an instruction from the cache memory, executing the read instruction, and then generating an address on the cache memory, in which the address is an address of an instruction to be next executed, for one clock cycle. Furthermore, it is desirable that the pattern generator can generate a test pattern in a shorter clock cycle, and thus it is desirable that a restriction of an executive operation for generating a test pattern is smaller.

SUMMARY

Therefore, it is an object of some aspects of the present invention to provide a test apparatus and an electronic device that can solve the foregoing problems. The above and other objects can be achieved by combinations described in the independent claims. The dependent claims define further advantageous and exemplary combinations of the present invention.

That is, according to the first aspect of the present invention, there is provided a test apparatus that tests a device under test. The test apparatus includes: a main memory that stores a test instruction stream determining a test sequence for testing the device under test; a sequence cache memory that caches the test instruction stream; a transfer section that reads the test instruction stream stored on the main memory and writes the read stream into the sequence cache memory in accordance with a described sequence; a pattern generating section that sequentially reads and executes instructions from the test instruction stream cached on the sequence cache memory and outputs a test pattern corresponding to the executed instruction; and a test signal output section that generates a test signal according to the test pattern and supplies the generated signal to the device under test, in which the transfer section overwrites the instruction read from the main memory on a space area on the sequence cache memory or an area on which executed instructions are stored and prohibits overwriting the read instruction on an area on which instructions in a predetermined range is stored, the instructions being located in the predetermined range forward from a final instruction among the executed instructions according to the described sequence.

According to the second aspect of the present invention, there is provided an electronic device. The electronic device includes: a circuit under test; and a test circuit that tests the circuit under test, and the test circuit includes: a main memory that stores a test instruction stream determining a test sequence for testing the circuit under test; a sequence cache memory that caches the test instruction stream; a transfer section that reads the test instruction stream stored on the main memory and writes the read stream into the sequence cache memory in accordance with a described sequence; a pattern generating section that sequentially reads and executes instructions from the test instruction stream cached on the sequence cache memory and outputs a test pattern corresponding to the executed instruction; and a test signal output section that generates a test signal according to the test pattern and supplies the generated signal to the circuit under test, in which the transfer section overwrites the instruction read from the main memory on a space area on the sequence cache memory or an area on which executed instructions are stored and prohibits overwriting the read instruction on an area on which instructions in a predetermined range is stored, the instructions being located in the predetermined range forward from a final instruction among the executed instructions according to the described sequence.

The summary does not necessarily describe all necessary features of the present invention. The present invention may also be a sub-combination of the features described above.

BRIEF DESCRIPTION OF THE DRAWINGS

FIG. 3 is a view exemplary explaining a pattern list stored on a pattern list memory 14, sequence data stored on a main memory 40, and pattern data.

FIG. 5 is a view exemplary showing sequence data (a test instruction stream) stored on a sequence cache memory 312.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
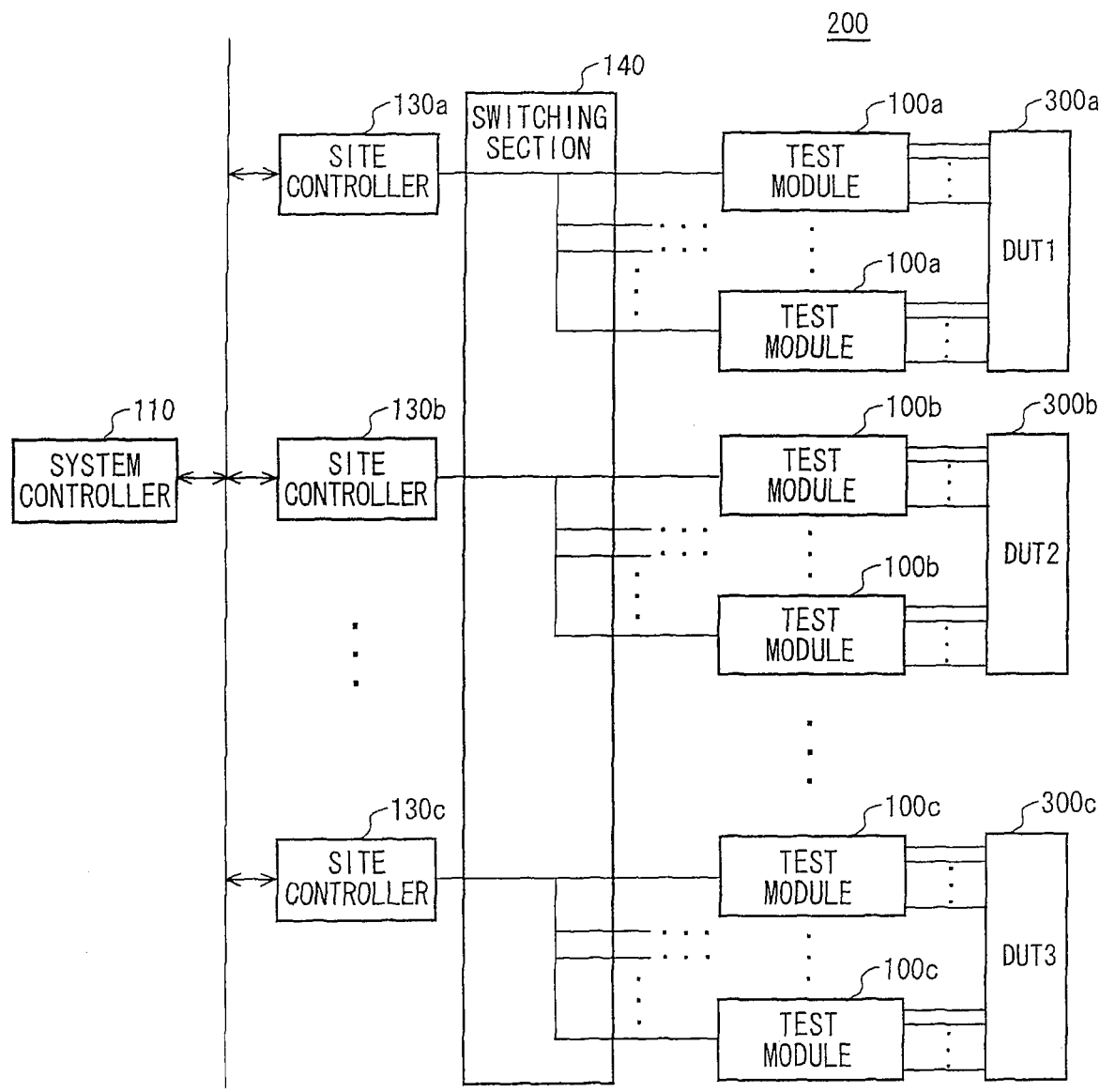
FIG. 1 is a view exemplary showing a configuration of a test apparatus 200 according to an embodiment of the present invention.

FIG. 1 is a view exemplary showing a configuration of a test apparatus 200 according to an embodiment of the present invention. The test apparatus 200 is an apparatus that tests a device under test 300 such as a semiconductor circuit, and includes a system controller 110, a plurality of site controllers 130, a switching section 140, and a plurality of test modules 100.

The system controller 110 receives a test control program, test program data, test data, and so on, which are used for testing the device under test 300 by the test apparatus 200, through an outside network or the like, and stores thereon them. The plurality of site controllers 130 is connected to the system controller 110 via a communication network.

The site controllers 130a to 130c control a test for either of the device under tests 300. For example, the plurality of site controllers 130 is provided one-on-one in correspondence with the plurality of devices under test 300, and each of the site controllers 130 controls a test for the corresponding device under test 300.

In FIG. 1, the site controller 130a controls a test for the device under test 300a and the site controller 130b controls a test for the device under test 300b. Alternatively, the plurality of site controllers 130 may respectively control a test for the plurality of devices under test 300.

More specifically, the site controller 130 acquires a test control program from the system controller 110, and executes the program. Next, the site controller 130 acquires test program (for example, sequence data to be described below) and test data (for example, pattern data to be described below) to be used for testing the corresponding device under test 300 from the system controller 110 based on the test control program. Then, the site controller 130 makes a module such as one or a plurality of test modules 100 store the test program and the test data to be used for testing this device under test 300 via the switching section 140. Next, the site controller 130 instructs the test module 100 via the switching section 140 to start a test based on the test program and the test data. Then, the site controller 130 receives interrupt showing that the test has been terminated, for example, from the test module 100, and makes the test module 100 perform the next test based on a test result.

The switching section 140 connects each of the plurality of site controllers 130 to one or the plurality of test modules 100 controlled by this site controller 130, and relays communication between them. Here, one predetermined site controller 130 may set the switching section 140 so as to make each of the plurality of site controllers 130 be connected to one or more the test modules 100 to be used for testing the device under test 300 by this site controller 130, based on an instruction of a user of the test apparatus 200, a test control program, and so on.

For example, in FIG. 1, the setting is performed so that the site controller 130a is connected to the plurality of test modules 100a, and a test for the device under test 300a is performed by means of these modules. Here, a configuration and an operation for testing the device under test 300 by the other site controller 130 by means of the test module 100 may be equal to a configuration and an operation for testing the device under test 300a by the site controller 130a. Hereinafter, it will be described with a focus on a configuration and an operation for testing the device under test 300a by the site controller 130a.

The test module 100a generates a timing signal at which a test signal to be used for testing the device under test 300a should be generated based on the instruction of the site controller 130a. Moreover, either of the test modules 100a may receives a test result by the other test module 100a to make the plurality of test modules 100a execute a sequence corresponding to a quality of the test result.

The plurality of test modules 100a is respectively connected to a part of a plurality of terminals of the device under test 300a, and tests the device under test 300a based on the sequence data and the pattern data stored by the site controller 130a. In case of testing the device under test 300a, the test module 100a generates a test signal from the pattern data based on the sequence data and the pattern data designated by a pattern list to be described below, and supplies the test signal to a terminal of the device under test 300a connected to this test module 100a.

Next, the test module 100a acquires an output signal output according to the operation of the device under test 300a based on the test signal, and compares the output signal with an expected value. Here, the plurality of test modules 100a may generate a test signal based on a different cycle period so as to dynamically change a cycle period of the test signal based on the sequence data and the pattern data.

Moreover, when a process of the test program has been completed or when an abnormality occurs during the execution of the test program, the test module 100a generates interrupt for the site controller 130a. This interrupt is notified to the site controller 130a corresponding to this test module 100a via the switching section 140, and interrupt handling is performed by a processor included in the site controller 130a.

As described above, the test apparatus 200 can be realized by open architecture and thus use various types of modules satisfying an open architecture standard. Then, the test apparatus 200 can insert and use a module such as the test module 100 into an arbitrary connection slot in the switching section 140.

In this case, a user or the like of the test apparatus 200 can change, for example, a connection mode of the switching section 140 via the site controller 130*a*, so that the plurality of modules to be used for testing the device under test 300 is connected to the site controller 130 for controlling a test for this device under test 300. According to this, the user of the test apparatus 200 can select an appropriate module in accordance with the number of terminals, the arrangement of terminals, the type of terminal, or the type of test of each of the plurality of devices under test 300, and mount the selected module on the test apparatus 200.

Moreover, the test apparatus 200 or the test module 100 may be a test circuit that is provided in the same electronic device along with a circuit under test to be tested. This test circuit is realized by a BIST circuit or the like of an electronic device, and diagnoses the electronic device by testing the circuit under test. According to this, this test circuit can check whether a circuit to be tested can perform a normal operation originally intended by the electronic device.

Moreover, the test apparatus 200 or the test module 100 may be a test circuit that is provided within the same board or apparatus as a circuit under test to be tested. Such a test circuit can check whether the circuit under test can perform a normal operation originally intended as described above.

Figure 2:
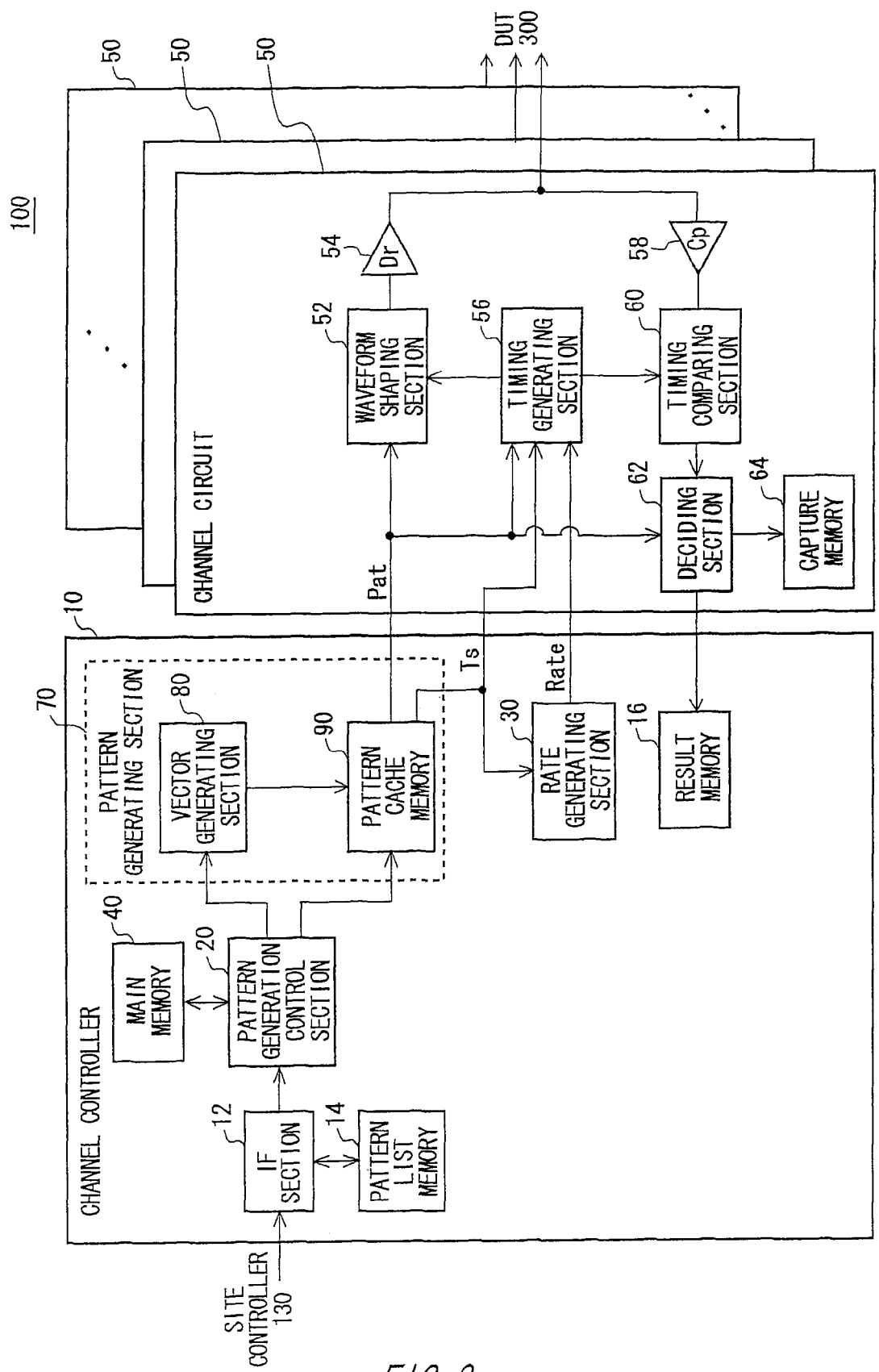
FIG. 2 is a view exemplary showing a configuration of a test module 100.

FIG. 2 is a view exemplary showing a configuration of the test module 100. The test module 100 has a channel controller 10 and a plurality of channel circuits 50. In this example, it will be explained about the function and configuration of one channel circuit 50, but other channel circuits 50 may also have the same function and configuration.

Each of the channel circuits 50 may be connected to the corresponding I/O pin of the device under test 300 to supply a test signal to this I/O pin. Moreover, each of the channel circuits 50 may measure an output signal from this I/O pin. In addition, the I/O pin of the device under test 300 may be either of an input pin or an output pin.

The channel controller 10 controls each of the channel circuits 50. For example, the channel controller 10 controls each of the channel circuits 50 to make each channel circuit generate a test signal. Moreover, the channel controller 10 controls each of the channel circuits 50 to make each channel circuit measure an output signal from the device under test 300.

Moreover, the channel controller 10 may control the other channel circuits 50 based on a measurement result by either of the channel circuits 50. For example, until the measurement result by either of the channel circuits 50 satisfies a predetermined condition, the channel controller 10 may make at least one of other channel circuits 50 repeatedly perform a predetermined operation, and make the other channel circuit 50 perform an operation to be next performed when the measurement result has satisfied the predetermined condition.

The channel controller 10 has an interface section 12, a pattern list memory 14, a result memory 16, a pattern generation control section 20, a main memory 40, a rate generating section 30, and a pattern generating section 70. The interface section 12 transfers data between the site controller 130 and the test module 100.

The main memory 40 stores a plural kind of sequence data and pattern data corresponding to the sequence data. The main memory 40 may previously store the sequence data and the pattern data provided from the site controller 130 before testing the device under test 300.

For example, the site controller 130 may input the sequence data and the pattern data, and an instruction by which these data should be stored at a designated address on the main memory 40 into the interface section 12. The pattern generation control section 20 stores these data on the main memory 40 in accordance with the instruction received from the interface section 12.

The sequence data may be data (a test instruction stream) showing, for example, an instruction group to be sequentially executed. The pattern data is data showing, for example, a logical value pattern, and the pattern data may be one-on-one stored in association with the plurality of instructions. For example, the sequence data may be an instruction group by which the pattern data are output in a predetermined sequence and thus test patterns are generated.

At this time, the sequence data may generate test patterns using each pattern data by multiple times. For example, the sequence data may include a loop instruction, a jump instruction, or the like. The channel controller 10 can develop the corresponding pattern data by executing such sequence data, and generate test signals according to the sequence data and the pattern data. An example of the sequence data and the pattern data stored on the main memory 40 will be described below in FIG. 3.

The pattern list memory 14 stores a pattern list showing sequence by which the sequence data stored on the main memory 40 should be executed. For example, the pattern list memory 14 may store a pattern list sequentially designating addresses on the main memory 40, in which the addresses are addresses for the sequence data to be executed. The pattern list memory 14 may previously store the pattern list provided from the site controller 130 before testing the device under test 300, similarly to the main memory 40. The pattern list may be an example of the above-described test control program, or may be a part of the test control program.

When starting the test for the device under test 300, the pattern generation control section 20 reads the pattern list from the pattern list memory 14. For example, when receiving an instruction for the test start from the site controller 130, the pattern generation control section 20 may read the pattern list from the pattern list memory 14.

The pattern generation control section 20 reads the sequence data and the corresponding pattern data stored on the main memory 40 in a sequence based on the pattern list. The pattern generation control section 20 sends the read sequence data to a vector generating section 80 of the pattern generating section 70. Moreover, the pattern generation control section 20 sends the read pattern data to a pattern cache memory 90 of the pattern generating section 70.

When a predetermined space area is generated on a cache memory of the subsequent-stage circuit, FIFO, and so on, the pattern generation control section 20 may read and send the next sequence data and pattern data. In this case, the pattern generation control section 20 may read the next sequence data and pattern data and send them to all cache memories, FIFO, and so on, on which the sequence data and the pattern data should be stored, on condition that the predetermined space area is generated on these cache memories and FIFO.

The pattern generating section 70 sequentially generates test patterns based on the sequence data and the pattern data sequentially received from the pattern generation control section 20. The pattern generating section 70 according to the present example has the vector generating section 80 and the pattern cache memory 90.

As described above, the vector generating section 80 receives the sequence data from the pattern generation control section 20. The vector generating section 80 may have a sequence cache memory that stores the received sequence data. The pattern cache memory 90 receives the pattern data from the pattern generation control section 20, and stores the received data at a predetermined address.

The vector generating section 80 sequentially executes the sequence data stored on the sequence cache memory to sequentially designate addresses of the pattern cache memory 90. For example, each instruction of the sequence data may be associated with an address of the pattern data to be specified in accordance with this instruction. Then, the vector generating section 80 sequentially designates addresses for the pattern cache memory 90 in accordance with a loop instruction, a jump instruction, and so on included in the sequence data.

The pattern cache memory 90 outputs the pattern data of the addresses that are sequentially specified. By such a configuration, it is possible to generate a test pattern having a logical pattern according to the sequence data and the pattern data. Moreover, when the execution of sequence data has been terminated, the sequence cache memory and the pattern cache memory 90 may open a storage area for this sequence data and the corresponding pattern data. The sequence data may have a terminated instruction showing a termination of sequence data at the end of the instruction group.

Each of the channel circuits 50 shapes a test signal based on the test pattern output from the pattern generating section, and inputs the shaped signal into the device under test 300. Moreover, the channel circuit 50 measures an output signal from the device under test 300. The channel circuit 50 has a waveform shaping section 52, a driver 54, a timing generating section 56, a comparator 58, a timing comparing section 60, a deciding section 62, and a capture memory 64.

The waveform shaping section 52 shapes a test signal based on the test pattern generated from the pattern generating section 70. For example, the waveform shaping section 52 may generate a test signal having a logical pattern according to this test pattern. Moreover, the waveform shaping section 52 may generate a test signal in accordance with a given timing signal. For example, the waveform shaping section 52 may generate a test signal of which a logical value transits in accordance with a given timing signal.

The driver 54 inputs the test signal generated from the waveform shaping section 52 into the device under test 300. The driver 54 may output a predetermined H-level voltage when the test signal generated from the waveform shaping section 52 shows High logic and output a predetermined L-level voltage when the test signal shows Low logic, in order to convert a voltage level of the test signal into a signal level to be input into the device under test 300.

The comparator 58 may receive the output signal from the device under test 300 and compare a voltage level of the output signal and a preset reference level, in order to convert the output signal into a binary logic signal. For example, the comparator 58 may output High logic when the voltage level of the output signal is larger than the reference level and output Low logic when the voltage level of the output signal is not more than the reference level.

The timing comparing section 60 acquires a logical value of the signal output from the comparator 58 in accordance with a given strobe signal. According to this, it is possible to detect a logical pattern of the output signal.

The timing generating section 56 generates the above-described timing signal and strobe signal in accordance with a set value of a previously given timing set. For example, the timing generating section 56 may generate a timing signal and a strobe signal obtained by delaying a rate signal, which is provided from the rate generating section 30 in a period according to a timing set, in a delay amount according to a given timing set.

A timing set may be provided to the rate generating section 30 and the timing generating section 56, for example, whenever one sequence data is executed. For example, the main memory 40 may include timing set data in a part of pattern data corresponding to this sequence data. The pattern generating section 70 may set a timing set corresponding to this sequence data in the rate generating section 30 and the timing generating section 56 whenever each sequence data is executed.

The deciding section 62 compares the logical pattern detected from the timing comparing section 60 and an expectation pattern. According to this, it is possible to decide a quality of the device under test 300. The pattern generating section 70 may generate the expectation pattern. For example, an expectation pattern may be equal to a logical pattern of a test signal to be input into the device under test 300, which is included in a test pattern generated from the pattern generating section 70.

The capture memory 64 stores a decision result by the deciding section 62. For example, the capture memory 64 may store a decision result such as a pass (match) or a fail (mismatch) by the deciding section 62 every test pattern. Moreover, the capture memory 64 may select and store a decision result for a fail by the deciding section 62.

Moreover, the result memory 16 in the channel controller 10 stores a decision result for each of the channel circuits 50 by the deciding section 62. The result memory 16 may store a decision result such as a pass (match) or a fail (mismatch) by each of the deciding sections 62 in association with each channel every test pattern. Moreover, the result memory 16 may select and store a decision result for a fail by each of the deciding sections 62.

As described above, the capture memory 64 may store fail information for each test pattern every channel circuit 50. On the contrary, the result memory 16 may store fail information for each sequence data stored on the pattern list memory 14, for example, every device under test 300.

FIG. 3 is a view exemplary explaining a pattern list stored on the pattern list memory 14, sequence data stored on the main memory 40, and pattern data. As described above, the main memory 40 stores pattern data respectively corresponding to the plurality of sequence data (sequence data 1, sequence data 2, and so on).

As described above, the sequence data include a plurality of instructions. When each instruction has been executed, the pattern generating section 70 may output pattern data corresponding to this instruction. For example, the sequence data may include a NOP instruction outputting the corresponding pattern data and shifting to the next instruction, a JMP instruction outputting the corresponding pattern data and further jumping to an instruction on a predetermined address, a LOOP instruction outputting the corresponding pattern data and further repeating instructions in a designated address range by the predetermined number of times, and so on.

By executing such an instruction group, each pattern data is output in a sequence according to sequence data, and a predetermined test pattern is generated. For example, when executing the sequence data 2, the pattern generating section 70 outputs pattern data A, and then repeatedly outputs data from pattern data B to pattern data C by the number of times specified by a LOOP instruction.

Moreover, the main memory 40 may store sequence data in common with the plurality of channel circuits 50. The main memory 40 may store pattern data for each of the channel circuits 50. For example, the main memory 40 may store pattern data corresponding to the plurality of channel circuits 50 for each instruction of sequence data. In an example of FIG. 3, the main memory 40 stores pattern data corresponding to each channel circuit 50 at a different bit position of each address.

The pattern list memory 14 stores a sequence of sequence data to be executed. In an example shown in FIG. 3, the pattern list memory 14 stores a pattern list sequentially specifying sequence data 2, sequence data 1, and so on.

Moreover, in an example shown in FIG. 2, the main memory 40 that stores the sequence data and the pattern data is provided in the channel controller 10. On the contrary, in another example, the main memory 40 that stores the sequence data may be provided in the channel controller 10, and a memory that stores the pattern data for each channel circuit 50 may be provided in each channel circuit 50.

In this case, the pattern cache memory 90 may be provided in each channel circuit 50. Then, addresses sequentially designated by the vector generating section 80 may be distributed to the pattern cache memory 90 provided in each channel circuit 50.

Figure 4:
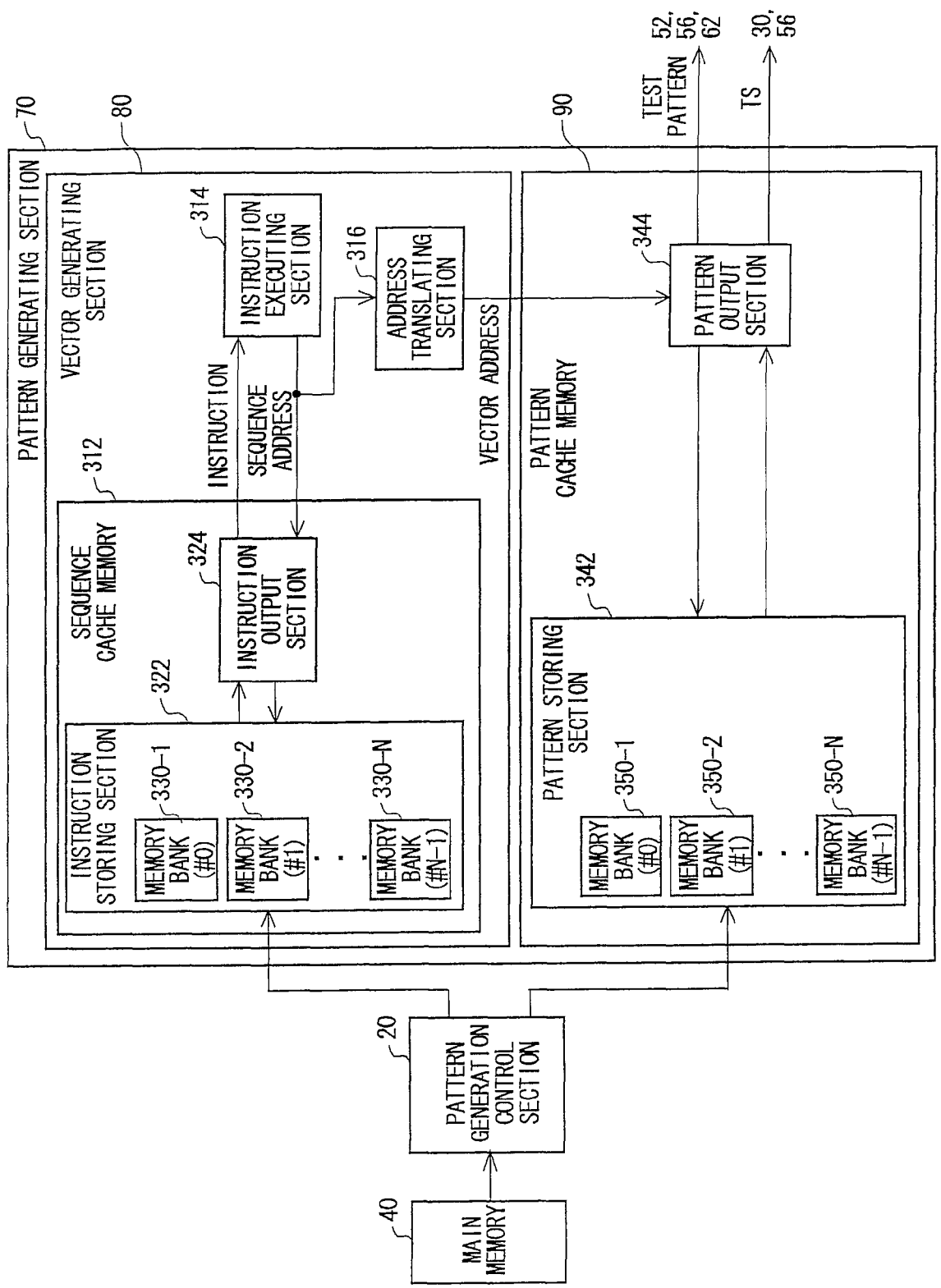
FIG. 4 is a view exemplary showing a configuration of a pattern generating section 70 according to the present embodiment along with a main memory 40 and a pattern generation control section 20.

FIG. 4 is a view exemplary showing a configuration of the pattern generating section 70 according to the present embodiment along with the main memory 40 and the pattern generation control section 20. The vector generating section 80 includes a sequence cache memory 312, an instruction executing section 314, and an address translating section 316. Moreover, the pattern cache memory 90 includes a pattern storing section 342 and a pattern output section 344.

As described above, the main memory 40 stores a test instruction stream (sequence data) determining a test sequence for testing the device under test 300. Furthermore, the main memory 40 stores a test pattern stream (pattern data) including test patterns each associated with instructions included in the test instruction stream.

The sequence cache memory 312 included in the vector generating section 80 caches a test instruction stream. The pattern cache memory 90 caches a test pattern stream. A plurality of instructions included in the test instruction stream cached by the sequence cache memory 312 and a plurality of test patterns included in the test pattern stream cached by the pattern cache memory 90 are associated with each other with one-to-one correspondence.

The pattern generation control section 20 is an example of a transfer section according to the present invention. The pattern generation control section 20 reads the test instruction stream stored on the main memory 40 and writes the read stream into the sequence cache memory 312 in accordance with a described sequence. As an example, the pattern generation control section 20 writes a test instruction stream into the sequence cache memory 312 in address sequence. As an example, the pattern generation control section 20 writes one instruction at one address of the sequence cache memory 312.

Moreover, the pattern generation control section 20 reads the test pattern stream stored on the main memory 40 and writes the read stream into the pattern cache memory 90 in accordance with a described sequence. As an example, the pattern generation control section 20 writes a test pattern stream into the pattern cache memory 90 in address sequence. As an example, the pattern generation control section 20 writes one test pattern at one address of the pattern cache memory 90.

The instruction executing section 314 sequentially reads and executes instructions from the test instruction stream stored on the sequence cache memory 312. An offset showing a position of each instruction in a test instruction stream is allotted to this instruction included in the test instruction stream.

The instruction executing section 314 sequentially reads and executes instructions in accordance with each offset to execute a test sequence determined by this test instruction stream. In other words, the instruction executing section 314 starts executing instructions from an instruction of a forehand offset of the test instruction stream and executes the instructions in order according to offsets. More specifically, the instruction executing section 314 repeats a process for executing instructions, specifying an offset of an instruction to be next executed, which is determined in accordance with the executed instruction, reading an instruction of the specified offset from the sequence cache memory 312, and executing the read instruction.

In the present embodiment, the instruction executing section 314 handles a sequence address showing a storage position on the sequence cache memory 312 as an offset. In other words, the instruction executing section 314 provides the sequence address to the sequence cache memory 312, and reads an instruction stored on the corresponding sequence address. Then, the instruction executing section 314 executes the read instruction, and specifies a sequence address showing an instruction to be next executed based on the executed instruction.

Moreover, timing set information (TS) specifying a set of timings for outputting the corresponding test pattern is associated with each instruction included in the sequence data. When an instruction has been executed, the instruction executing section 314 makes the pattern cache memory 90 output timing set information associated with this instruction to the rate generating section 30 and the timing generating section 56 in association with a test pattern output from the pattern cache memory 90.

The address translating section 316 translates the sequence address output from the instruction executing section 314 into a vector address. More in detail, the address translating section 316 translates a sequence address into a vector address specifying a test pattern corresponding to the instruction stored at the sequence address.

The address translating section 316 provides the translated vector address to the pattern cache memory 90, and causes the pattern cache memory 90 to output a test pattern corresponding to an instruction executed by the instruction executing section 314. The pattern cache memory 90 supplies the test pattern to the channel circuit 50. Then, the channel circuit 50 generates a test signal according to the supplied test pattern, and supplies the test signal to the device under test 300. As an example, the pattern cache memory 90 supplies a test pattern to the waveform shaping section 52, the timing generating section 56, and the deciding section 62.

The sequence cache memory 312 includes an instruction storing section 322 and an instruction output section 324. The instruction storing section 322 has a plurality of memory banks 330. In the present embodiment, the instruction storing section 322 has N (N is an integer not less than two) memory banks 330. As an example, N may be M-th power of two (M is an integer not less than one). The plurality of memory banks 330 has the same address space with respect to one another. Each of the plurality of memory banks 330 may have, as an example, addresses storing L-th power of two instructions (L is an integer not less than one).

Moreover, the plurality of memory banks 330 functions as a ring buffer as a whole. In other words, the pattern generation control section 20 writes the test instruction streams read from the main memory 40 into the plurality of memory banks 330 in bank sequence and address sequence in the bank. Then, when an instruction is written at a final address of a final bank, the pattern generation control section 20 writes the next instruction at a first address of a first bank. In other words, the pattern generation control section 20 writes the test instruction streams read from the main memory 40 in address sequence in a traveling way.

The instruction output section 324 is supplied with an sequence address from the instruction executing section 314. The instruction output section 324 reads an instruction stored at the supplied sequence address from the instruction storing section 322, and sends back the read instruction to the instruction executing section 314.

Here, when the instruction storing section 322 has the plurality of memory banks 330, the instruction executing section 314 may output, as an example, a sequence address expressing an internal address specifying an address in a bank as a low-order digit and expressing a bank address specifying the bank as a high-order digit. For example, if each memory bank 330 has L-th power of two addresses, the instruction executing section 314 may output a sequence address expressing an internal address as digits from a first digit to an L-th digit and expressing a bank address as digits above an (L+1)th digit.

Furthermore, when the instruction storing section 322 functions as a ring buffer by N memory banks 330, the instruction output section 324 selects the memory bank 330 from which instructions should be read in accordance with the remainder obtained by dividing high-order digits of the given sequence address by N. In addition, if N is M-th power of two, low-order M digits within a bank address are identical with a remainder. Therefore, when the instruction storing section 322 has M-th power of two memory banks 330, the instruction output section 324 may, as an example, select the memory bank 330 in accordance with low-order M digits within a bank address in a sequence address. Then, the instruction output section 324 reads an instruction from an address specified by the low-order digits of the sequence address in the selected memory bank 330.

The pattern cache memory 90 includes a pattern storing section 342 and a pattern output section 344. The pattern storing section 342 has a plurality of memory banks 350. In the present embodiment, the pattern storing section 342 has N memory banks 350 of the same number as that of the memory banks 330 included in the instruction storing section 322. The plurality of memory banks 350 has the same address space as one another. As an example, each of the plurality of memory banks 350 may have the number of addresses storing power-of-two test patterns.

Moreover, the plurality of memory banks 350 functions as a ring buffer as a whole. In other words, the pattern generation control section 20 writes the test pattern streams, which are read from the main memory 40, into the plurality of memory banks 350 in bank sequence and address sequence in the bank. Then, when a test pattern is written into a final address of a final bank, the pattern generation control section 20 writes the next test pattern into a first address of a forehand bank. In other words, the pattern generation control section 20 writes the test pattern streams read from the main memory 40 in address sequence in a traveling way.

The pattern output section 344 is supplied with a vector address from the address translating section 316. The pattern output section 344 reads a test pattern specified by the given vector address from the pattern storing section 342, and outputs it to an outside.

Here, when the pattern storing section 342 has the plurality of memory banks 350, the address translating section 316 may, as an example, output a vector address expressing an internal address specifying an address in the bank with low-order digits and expressing a bank address specifying the bank with high-order digits. For example, if each memory bank 350 has L-th power of two addresses, the address translating section 316 may output a vector address expressing an internal address as digits from the first digit to the L-th digit and expressing a bank address as digits above the (L+1)th digit.

Furthermore, when the pattern storing section 342 functions as a ring buffer by N memory banks 350, the pattern output section 344 selects the memory bank 350 from which a test pattern should be read in accordance with the remainder obtained by dividing high-order digits of the given vector address by N. In addition, when the pattern storing section 342 has M-th power of two memory banks 350, the pattern output section 344 may, as an example, select the memory bank 350 in accordance with low-order M digits within a bank address in a vector address. Then, the pattern output section 344 reads a test pattern from the address specified by the low-order digits of the vector address in the selected memory bank 350.

FIG. 5 is a view exemplary showing sequence data (a test instruction stream) stored on the sequence cache memory 312. As an example, the sequence data may include a NOP instruction, a jump instruction (a JMP instruction), a waiting instruction (an IDXI instruction), a terminated instruction (an EXIT instruction), and so on. When a NOP instruction has been executed, the instruction executing section 314 specifies an instruction to which the following offset of the NOP instruction is allotted as an instruction to be next executed.

A jump instruction (a JMP instruction) is an example of a forward branch instruction. The JMP instruction specifies an executed instruction prior to this JMP instruction as an instruction to be next executed, when the JMP instruction does not satisfy (or satisfies) a specified condition. According to this, the instruction executing section 314 can again returns a process to the executed instruction and repeat the process from the executed instruction to the jump instruction.

Furthermore, when the JMP instruction satisfies (does not satisfy) a specified condition, the JMP instruction specifies an instruction to which the following offset of this JMP instruction is allotted as an instruction to be next executed. According to this, the instruction executing section 314 can escape a loop process and advance the process to the next instruction. In addition, in the present embodiment, the instruction executing section 314 can return the process to instructions located in a predetermined range forward from a forward branch instruction, but cannot return the process in excess of the predetermined range, in the case of executing the forward branch instruction. For example, the instruction executing section 314 can return the process to instructions in a 512-word range forward from a forward branch instruction and cannot return the process to instructions preceding a 513 word, in the case of executing the forward branch instruction. Moreover, in the present embodiment, in the case of executing a forward branch instruction, the instruction executing section 314 cannot return back the process in excess of an instruction becoming a return point of another forward branch instruction posterior to this forward branch instruction.

A waiting instruction (an IDXI instruction) is an instruction repeatedly outputting the corresponding pattern data by the specified number of times. When executing the IDXI instruction, the instruction executing section 314 does not move a process to the next instruction while counting a designated cycle after executing this IDXI instruction. Then, when executing the IDXI instruction, the instruction executing section 314 specifies an instruction to which the following offset of this IDXI instruction is allotted as an instruction to be next executed after the designated cycle has been passed.

A terminated instruction (an EXIT instruction) is an instruction terminating the execution of a main test instruction stream. When executing the EXIT instruction, the instruction executing section 314 terminates the execution of this main test instruction stream without specifying an instruction to be next executed.

Figure 6:
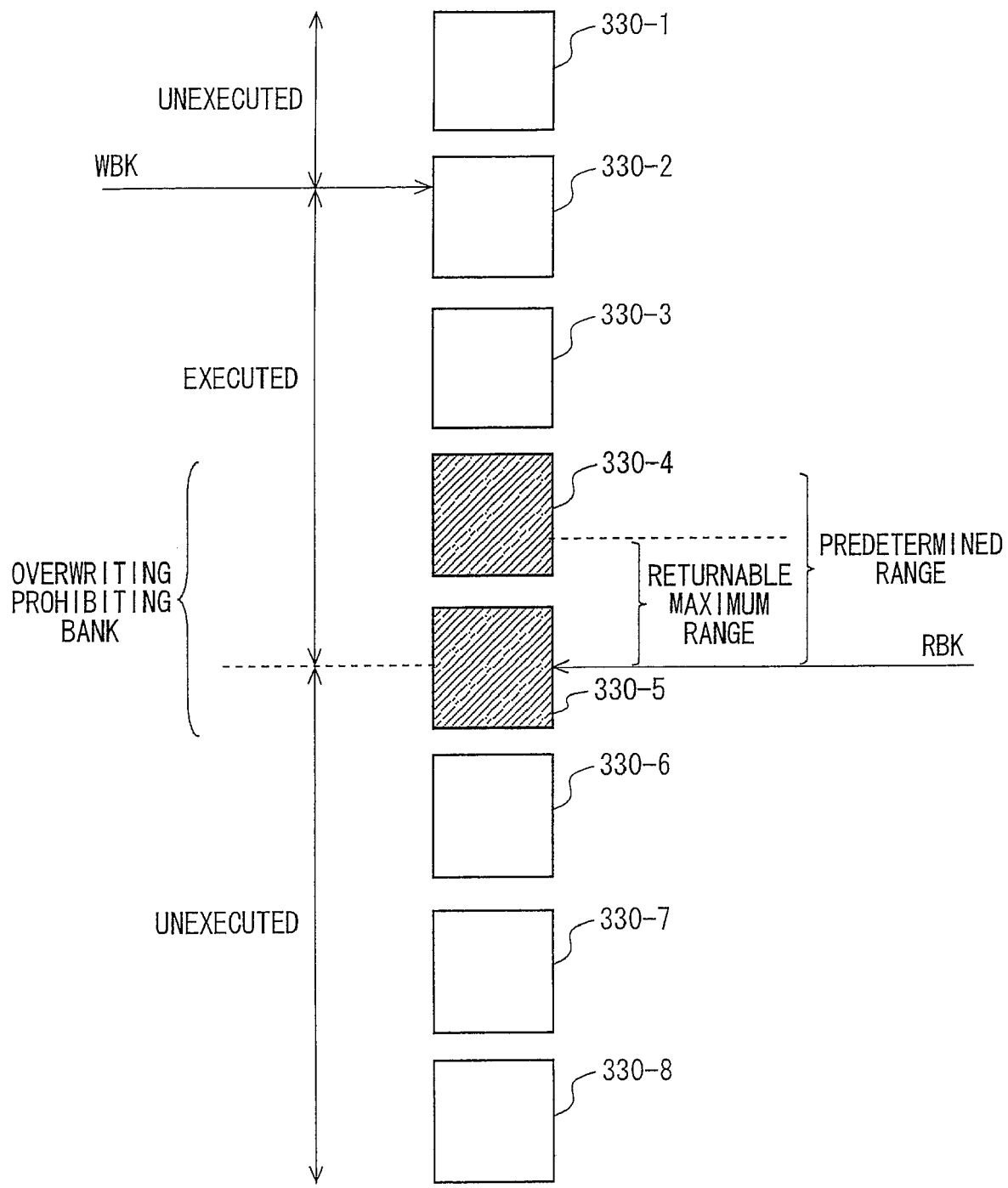
FIG. 6 is a view exemplary showing a prohibiting range of overwriting for a plurality of memory banks 330 included in a sequence cache memory 312.

FIG. 6 is a view exemplary showing a prohibiting range of overwriting for the plurality of memory banks 330 included in the sequence cache memory 312. Here, among instructions (executed instructions) already executed by the instruction executing section 314, it is considered that a pointer that indicates a final instruction in a test instruction stream according to a described sequence is an already-read pointer RBK. Moreover, it is considered that a pointer that indicates an instruction finally written by the pattern generation control section 20 is an already-written pointer WBK.

The pattern generation control section 20 writes the test instruction streams read from the main memory 40 into the sequence cache memory 312 in address sequence in a traveling way. In this case, the pattern generation control section 20 performs a writing restriction so that the read instructions are not overwritten on an area storing instructions in a predetermined range forward from the already-read pointer RBK by means of the already-written pointer WBK. In other words, the pattern generation control section 20 overwrites the instructions read from the main memory 40 on a space area on the sequence cache memory 312 or an area storing the executed instructions and prohibits overwriting the instructions on an area storing instructions in a predetermined range forward from a final instruction among the executed instructions according to the described sequence.

Here, as an example, a predetermined range may be a range larger than a maximum range (a returnable maximum range) capable of being again executed by executing a forward branch instruction such as a JMP instruction. For example, when instructions before maximum 512 words from the already-read pointer RBK may be again executed by, e.g., a JMP instruction, a predetermined range may be a range larger than a range from the already-read pointer RBK to an instruction before 512 words from this already-read pointer.

In other words, the pattern generation control section 20 overwrites the instructions on an area storing instructions not capable of being again executed by a forward branch instruction after a presently-running instruction and prohibits overwriting the instruction on an area storing instructions in a returnable maximum range forward from a final instruction among the executed instructions according to the described sequence. When instructions before maximum 512 words from the already-read pointer RBK may be again executed by, e.g., a JMP instruction, the pattern generation control section 20 prohibits overwriting a new instruction on an area including a range from the already-read pointer RBK to an instruction before 512 words and overwrites the new instruction on an area excepting the inhibited area in which executed instructions are stored.

Moreover, as an example, the pattern generation control section 20 may prohibit overwriting in a unit of the memory bank 330. In other words, as an example, the pattern generation control section 20 may wait writing a test instruction stream into the memory bank 330 including an area storing instructions in a predetermined range forward from a final instruction among the executed instructions according to the described sequence.

By performing such a writing restriction, the pattern generation control section 20 can cause the sequence cache memory 312 to cache instructions prior to the execution by the pattern generating section 70 without erasing instructions capable of again executed by the execution of the forward branch instruction from the sequence cache memory 312. According to this, the pattern generating section 70 can surely read instructions from the sequence cache memory 312.

Figure 7:
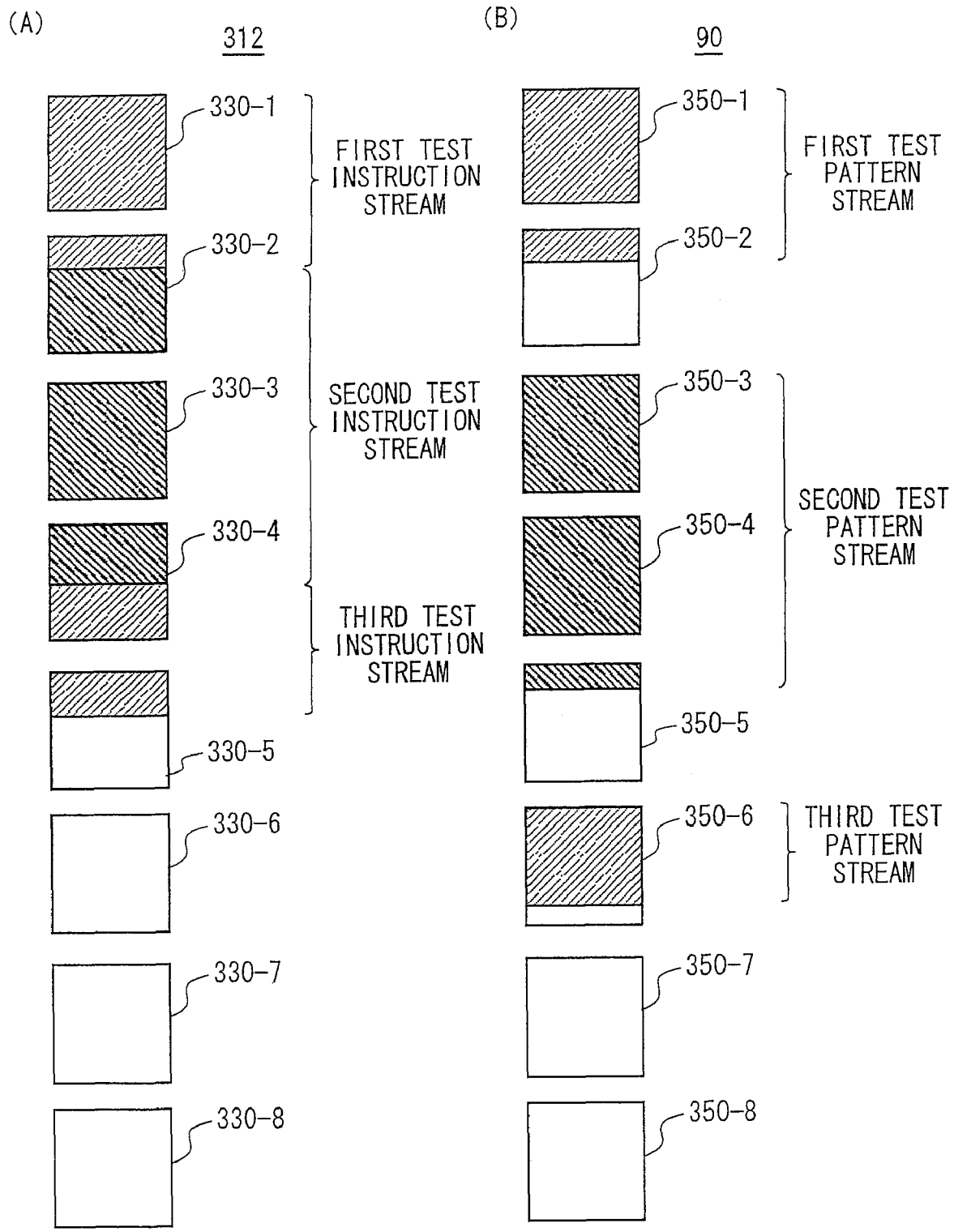
FIGS. 7A and 7B are views exemplary showing a method for writing a test instruction stream and a test pattern stream into a plurality of memory banks 330 and 350.

FIGS. 7A and 7B is a view exemplary showing a method for writing a test instruction stream and a test pattern stream into the plurality of memory banks 330 and 350. As described above, the pattern generation control section 20 reads the plurality of test instruction streams and the corresponding plurality of test pattern streams stored on the main memory 40 in accordance with the pattern list stored on the pattern list memory 14. Then, the pattern generation control section 20 writes the read plurality of test instruction streams into the sequence cache memory 312, and writes the read plurality of test pattern streams into the pattern cache memory 90.

Here, as shown in FIG. 7A, when the plurality of test instruction streams is written into the plurality of memory banks 330 in the sequence cache memory 312, the pattern generation control section 20 writes a first test instruction stream and a second test instruction stream following the first test instruction stream at consecutive addresses within the same bank. In other words, the pattern generation control section 20 writes the plurality of test instruction streams, which is continuously executed, into a bank without a clearance. That is, the pattern generation control section 20 continuously writes the first test instruction stream and the second test instruction stream to be continuously executed into the same memory bank 330 in the sequence cache memory 312. According to this, the pattern generation control section 20 can reduce a process burden of the subsequent-stage instruction executing section 314.

Moreover, as shown in FIG. 7B, when the plurality of test pattern streams is written into the plurality of memory banks 350 in the pattern cache memory 90, the pattern generation control section 20 writes a forehand instruction of each test pattern stream at the head of the memory bank 350. In other words, when the writing of the first test pattern stream corresponding to the first test instruction stream has been ended in the middle of the memory bank 350, the pattern generation control section 20 starts writing the second test pattern corresponding to the second test instruction stream following the first test instruction stream from the head of the next memory bank 350. That is, the pattern generation control section 20 writes the second test pattern stream corresponding to the second test instruction stream from the head of the memory bank 350 different from the memory bank 350 in the pattern cache memory 90 into which the first test pattern stream corresponding to the first test instruction stream is written. According to this, according to the pattern generation control section 20, writing becomes easy in a bank unit.

Figure 8:
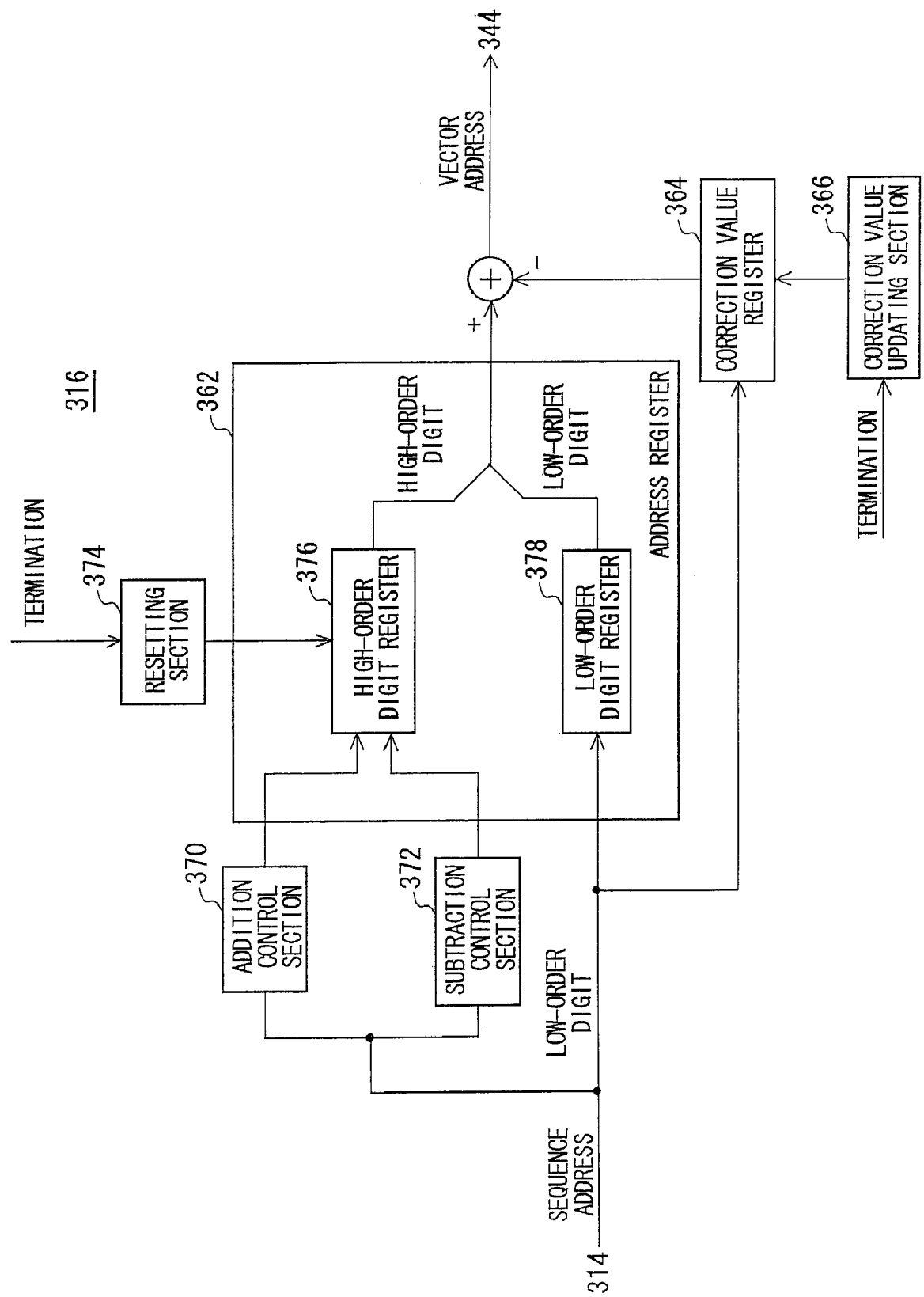
FIG. 8 is a view exemplary showing a configuration of an address translating section 316 for reading a test pattern from a pattern cache memory 90 into which a plurality of test pattern streams is written as shown in FIGS. 7A and 7B.

FIG. 8 is a view exemplary showing a configuration of the address translating section 316 for reading a test pattern from the pattern cache memory 90 into which a plurality of test pattern streams is written as shown in FIGS. 7A and 7B. The address translating section 316 receives a sequence address that is an address of the sequence cache memory 312 from the instruction executing section 314. The address translating section 316 converts the input sequence address into a vector address specifying a position of a test pattern to be output in a test pattern stream, and output it.

In addition, the sequence cache memory 312 and the pattern cache memory 90 include a plurality of memory banks having L-th power of two addresses. The sequence address and the vector address express an address in the bank with low-order digits from the first digit to the L-th digit and expresses a bank address with high-order digits above the (L+1)th digit.

The address translating section 316 includes an address register 362, and a correction value register 364, a correction value updating section 366, a subtracter 368, an addition control section 370, a subtraction control section 372, and a resetting section 374. The address register 362 stores a vector address. The address register 362 includes a high-order digit register 376 and a low-order digit register 378. The high-order digit register 376 stores high-order digits of the vector address. The low-order digit register 378 receives low-order digits of the given sequence address, and stores the digits as low-order digits of the vector address.

The correction value register 364 stores a correction value. The correction value updating section 366 stores the low-order digits of the given sequence address on the correction value register 364 as a correction value upon termination of the test instruction stream. As an example, the correction value updating section 366 may store the low-order digits of the sequence address on the correction value register 364 as a correction value on condition that an EXIT instruction has been detected.

The subtracter 368 subtracts the correction value from the vector address stored on the address register 362.

The subtracter 368 outputs a vector address obtained by subtracting the correction value to the pattern output section 344.

When a process advances to an instruction in the next memory bank 330 beyond a boundary of the memory bank 330 in the sequence cache memory 312 during executing the test instruction stream, the addition control section 370 adds one to a value of the high-order digit register 376. As an example, the addition control section 370 may detect a change from a cycle before the sequence address to judge whether a process advances to an instruction in the next memory bank 330 beyond a boundary of the memory bank 330 in the sequence cache memory 312.

When a process returns to an instruction in the forward memory bank 330 beyond a boundary of the memory bank 330 in the sequence cache memory 312 during executing the test instruction stream, the subtraction control section 372 subtracts one from a value of the high-order digit register 376. As an example, the subtraction control section 372 may detect a change from a cycle before the sequence address to judge whether a process returns to an instruction in the forward memory bank 330 beyond a boundary of the memory bank 330 in the sequence cache memory 312.

The resetting section 374 resets a value of the high-order digit register 376 to zero in the next cycle of a cycle at which the test instruction stream has been terminated. As an example, the resetting section 374 may detect that the test instruction stream has been terminated on condition that an EXIT instruction has been detected.

According to the address translating section 316 with a configuration as described above, it is possible to output a vector address of which a value becomes zero in the head of the test pattern stream and increases and decreases in synchronization with increase or decrease of the sequence address. According to this, the address translating section 316 can output a vector address showing a position of a test pattern corresponding to an instruction to be executed in a test pattern stream.

Figure 9:
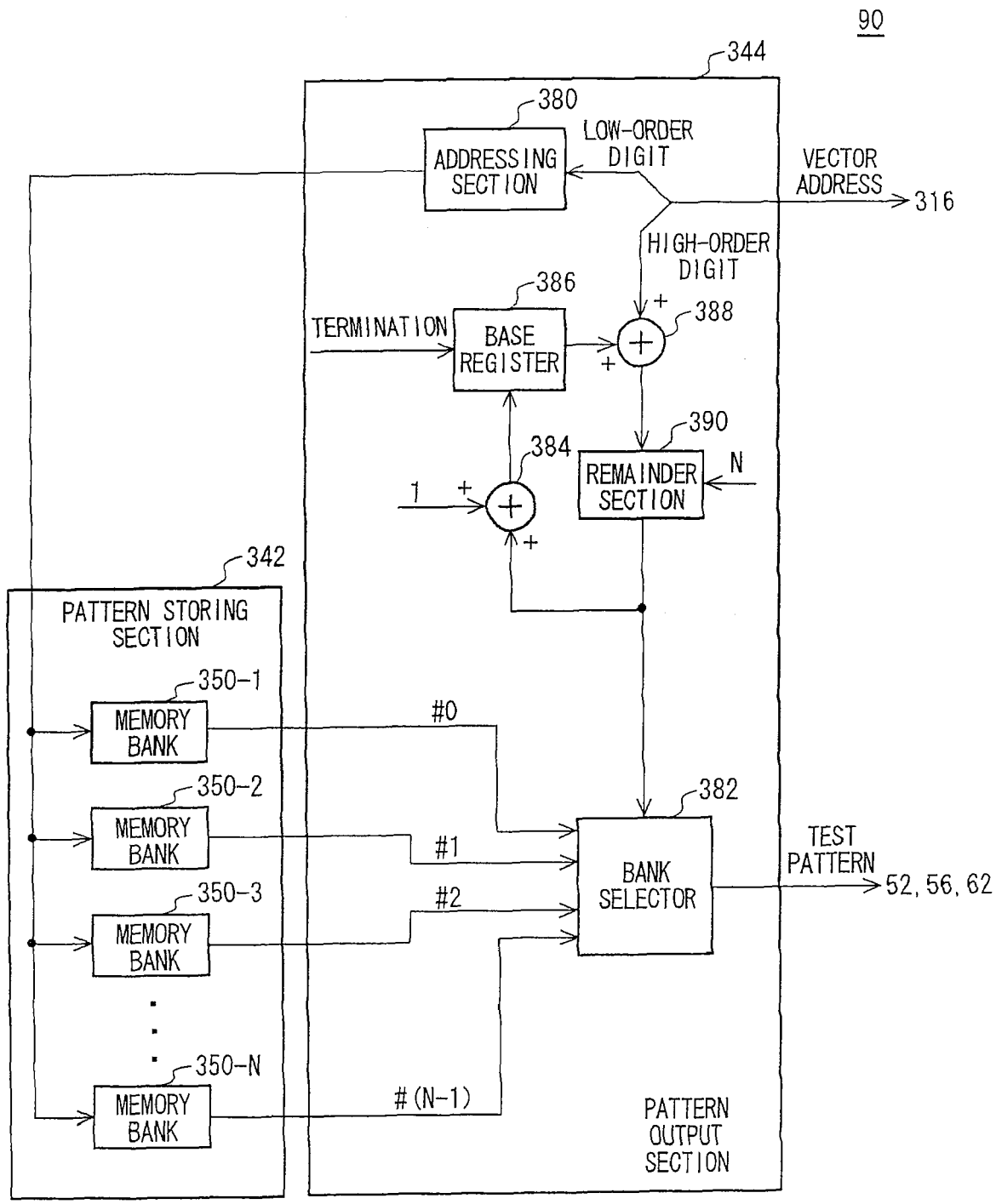
FIG. 9 is a view exemplary showing a configuration of a pattern output section 344 for reading a test pattern from a pattern cache memory 90 into which a plurality of test pattern streams is written as shown in FIGS. 7A and 7B, along with a pattern storing section 342.

FIG. 9 is a view exemplary showing a configuration of the pattern output section 344 for reading a test pattern from the pattern cache memory 90 into which a plurality of test pattern streams is written as shown in FIGS. 7A and 7B, along with the pattern storing section 342. The pattern output section 344 is supplied with the vector address from the address translating section 316 shown in FIG. 8.

The pattern output section 344 includes an addressing section 380, a bank selector 382, a first adder 384, a base register 386, a second adder 388, and a remainder section 390. The addressing section 380 provides low-order digits of the given vector address to each of the plurality of memory banks 350 within the pattern storing section 342.

The bank selector 382 selects one memory bank 350 according to the given bank address among the plurality of memory banks 350. The bank selector 382 reads and outputs a test pattern located at an address, which is specified by the addressing section 380, in the selected memory bank 350.

The first adder 384 adds one to the bank address given to the bank selector 382. The base register 386 stores a value output from the first adder 384 upon termination of the just precedent test instruction stream. In other words, the base register 386 holds, as a base address, a value obtained by adding one to a bank address specifying the memory bank 350 from which a test pattern is read, upon termination of the just precedent test instruction stream. As an example, the base register 386 may acquire a value obtained by adding one to a bank address specifying the memory bank 350 from which a test pattern is read, on condition that an EXIT instruction has been detected. According to this, the base register 386 can store, as a base address, a value expressing the memory bank 350 next to the memory bank 350 from which a final instruction of the just precedent test instruction stream is written.

The second adder 388 outputs an addition value obtained by adding the high-order digits of the vector address and the base address. When reading the plurality of consecutive test pattern streams, the second adder 388 can output an addition value expressing the bank address accumulated from the start of the test.

The remainder section 390 computes the remainder by dividing the addition value output from the second adder 388 by N that is the number of the memory banks 350. Then, the remainder section 390 provides the computed remainder to the bank selector 382 as a bank address. According to this, the remainder section 390 can specify one memory bank 350 among the plurality of memory banks 350 in a traveling way.

According to such a pattern output section 344, it is possible to continuously output the plurality of test pattern streams from the pattern cache memory 90 into which the plurality of test pattern streams is written as shown in FIGS. 7A and 7b. In other words, the pattern output section 344 can output, after the first test pattern stream has been terminated, the second test pattern stream to be output next to the first test pattern stream from the head of the memory bank 350 next to the memory bank 350, from which the test patterns are read upon termination of the first test pattern stream.

Figure 10:
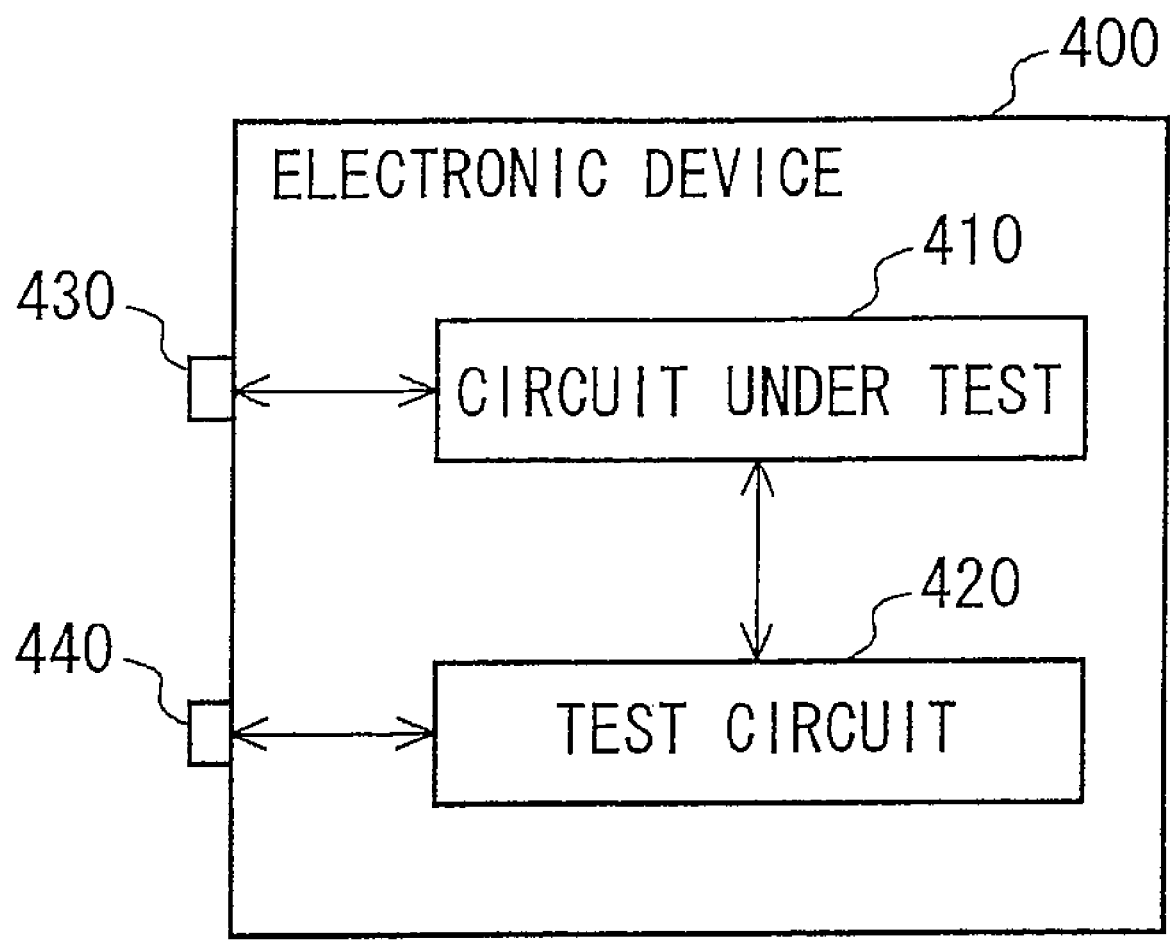
FIG. 10 is a view exemplary showing a configuration of an electronic device 400 according to an embodiment of the present invention.

FIG. 10 is a view exemplary showing a configuration of an electronic device 400 according to an embodiment of the present invention. The electronic device 400 has a circuit under test 410, a test circuit 420, an I/O pin 430, and a BIST pin 440. The circuit under test 410 may be a circuit for operating during mounting the electronic device 400. The circuit under test 410 operates in accordance with a signal provided from the I/O pin 430 during mounting the electronic device 400.

For example, when the electronic device 400 is a memory device, the circuit under test 410 may be a circuit including memory cells of the electronic device 400. For example, the circuit under test 410 may be memory cells and a control circuit for controlling the memory cells. The control circuit may be a circuit that controls writing data into the memory cell and reading data from the memory cell.

The test circuit 420 is provided in a semiconductor chip equal to the circuit under test 410, and tests the circuit under test 410. The test circuit 420 may have a configuration equal to that of the test module 100 described with reference to FIGS. 1 to 9. Moreover, the test circuit 420 may have a configuration of a part of the test module 100. Moreover, the test circuit 420 may be a circuit that performs a function of a part of the test module 100. For example, the test circuit 420 may not have the result memory 16. Moreover, the rate generating section 30 and the timing generating section 56 in the test circuit 420 may operate according to a set value of the fixed timing set.

Moreover, when a signal by which a self test of the circuit under test 410 is performed is provided from an outside test apparatus via the BIST pin 440, the test circuit 420 may test the circuit under test 410. It is preferable that the BIST pin 440 is a pin that is not used during mounting the electronic device 400. Moreover, the test circuit 420 may output a test result for the circuit under test 410 from the BIST pin 440 to the outside test apparatus.

The outside test apparatus may perform an operation similar to that of the site controller 130 described with reference to FIG. 1. In other words, a test control program, a test program, test data, and so on may be supplied to the test circuit 420, in order to make the test circuit 420 function similarly to the test module 100 described with reference to FIGS. 1 to 9.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A test apparatus that tests a device under test, comprising:
    a main memory that stores a test instruction stream, the test instruction stream determining a test sequence for testing the device under test;
    a sequence cache memory that caches the test instruction stream;
    a transfer section that reads the test instruction stream stored on the main memory and writes the read stream into the sequence cache memory in accordance with a described sequence;
    a pattern generating section that sequentially reads and executes instructions from the test instruction stream cached on the sequence cache memory and outputs a test pattern corresponding to the executed instruction; and
    a test signal output section that generates a test signal according to the test pattern and supplies the generated signal to the device under test,
    wherein the transfer section overwrites the instruction read from the main memory on a space area on the sequence cache memory or an area on which executed instructions are stored and prohibits overwriting the read instruction on an area on which instructions in a predetermined range is stored, the instructions being located in the predetermined range forward from a final instruction among the executed instructions according to the described sequence, and
    wherein the transfer section overwrites the read instruction on an area storing instructions that are not again executed by a forward branch instruction after a presently-running instruction and prohibits overwriting the read instruction on an area storing instructions in a maximum range that are again executed by executing a forward branch instruction forward from the final instruction among the executed instructions according to the described sequence.

2. The test apparatus as claimed in claim 1, wherein the transfer section writes the test instruction stream read from the main memory in address sequence cyclically.

3. The test apparatus as claimed in claim 1, wherein the sequence cache memory has a plurality of memory banks,
    the transfer section writes the test instruction stream read from the main memory into the plurality of memory banks in order, and waits writing the test instruction stream into the memory bank including the area storing the instructions in the predetermined range forward from the final instruction among the executed instructions according to the described sequence.

4. The test apparatus as claimed in claim 1, wherein
    the main memory stores a test pattern stream including test patterns each associated with instructions included in the test instruction stream,
    the test apparatus further comprises a pattern cache memory that caches the test pattern stream,
    the transfer section reads the test pattern stream stored on the main memory and writes the read stream into the pattern cache memory in accordance with the described sequence, and
    the pattern generating section comprises:
    an instruction executing section that reads an instruction stored on the sequence cache memory by providing a sequence address showing a storage position for the instruction, executes the read instruction, and specifies a sequence address showing an instruction to be next executed based on the executed instruction;
    a converting section that converts the sequence address specified by the instruction executing section into a vector address specifying a test pattern corresponding to an instruction stored at this sequence address; and
    a pattern output section that makes the pattern cache memory output the test pattern specified by the vector address.

5. The test apparatus as claimed in claim 4, wherein
    the main memory stores a plurality of test instruction streams determining a plurality of test sequences and a plurality of corresponding test pattern streams,
    each of the sequence cache memory and the pattern cache memory has a plurality of memory banks having the same address space, and
    the transfer section continuously writes a first test instruction stream and a second test instruction stream to be continuously executed into the same memory bank in the sequence cache memory, and writes a second test pattern stream corresponding to the second test instruction stream into a memory bank different from the memory bank in the pattern cache memory, into which a first test pattern stream corresponding to the first test instruction stream is written, from a beginning address of the different memory bank.

6. The test apparatus as claimed in claim 5, wherein
    the sequence address and the vector address have a high-order digit indicative of an address specifying the memory bank and a low-order digit indicative of an address within the memory bank, and
    the converting section comprises:
    an address register that includes a high-order digit register for storing a high-order digit of the vector address and a low-order digit register for storing a low-order digit of the given sequence address as a low-order digit of the vector address;
    a correction value register that stores a correction value;
    a correction value updating section that stores the low-order digit of the sequence address on the correction value register as a correction value upon termination of the test instruction stream; and a subtracter that subtracts the correction value from the vector address stored on the address register and outputs the result.

7. The test apparatus as claimed in claim 6, wherein the converting section further comprises an addition control section that adds, in the case of executing the test instruction stream, one to a value of the high-order digit register when an instruction in a next memory bank beyond a boundary of the memory bank in the sequence cache memory is processed.

8. The test apparatus as claimed in claim 7, wherein the converting section further comprises a subtraction control section that subtracts, in the case of executing the test instruction stream, one from the value of the high-order digit register when an instruction in a forward memory bank beyond a boundary of the memory bank in the sequence cache memory is processed.

9. An electronic device comprising:

a circuit under test; and a test circuit that tests the circuit under test, and the test circuit comprising:

a main memory that stores a test instruction stream, the test instruction stream determining a test sequence for testing the circuit under test;

a sequence cache memory that caches the test instruction stream;

a transfer section that reads the test instruction stream stored on the main memory and writes the read stream into the sequence cache memory in accordance with a described sequence;

a pattern generating section that sequentially reads and executes instructions from the test instruction stream cached on the sequence cache memory and outputs a test pattern corresponding to the executed instruction; and a test signal output section that generates a test signal according to the test pattern and supplies the generated signal to the circuit under test, wherein the transfer section overwrites the instruction read from the main memory on a space area on the sequence cache memory or an area on which executed instructions are stored and prohibits overwriting the read instruction on an area on which instructions in a predetermined range are stored, the instructions being located in the predetermined range forward from a final instruction among the executed instructions according to the described sequence, and wherein the transfer section overwrites the read instruction on an area storing instructions that are not again executed by a forward branch instruction after a presently-running instruction and prohibits overwriting the read instruction on an area storing instructions in a maximum range that are again executed by executing a forward branch instruction forward from the final instruction among the executed instructions according to the described sequence.

* * * * *